United States Patent [19]

Mackessy

[11] Patent Number: 5,736,432
[45] Date of Patent: Apr. 7, 1998

[54] LEAD FRAME WITH LEAD FINGER LOCKING FEATURE AND METHOD FOR MAKING SAME

[75] Inventor: Owen Michael Mackessy, San Jose, Calif.

[73] Assignee: National Semiconductor Corporation, Santa Clara, Calif.

[21] Appl. No.: 717,481

[22] Filed: Sep. 20, 1996

[51] Int. Cl.⁶ ................................. H01L 21/60
[52] U.S. Cl. .................... 438/123; 438/106; 257/676
[58] Field of Search ........................ 437/220, 209; 257/676, 666; 438/106, 123

[56] References Cited

U.S. PATENT DOCUMENTS

| | | | |
|---|---|---|---|
| 5,038,198 | 8/1991 | Perniciaro Spatrisano et al. | 357/81 |
| 5,233,131 | 8/1993 | Liang et al. | 29/827 |
| 5,281,849 | 1/1994 | Simgh Deo et al. | 257/666 |
| 5,360,992 | 11/1994 | Lowrey et al. | 257/666 |
| 5,389,739 | 2/1995 | Mills | 257/666 |
| 5,455,200 | 10/1995 | Bigler et al. | 437/220 |
| 5,486,722 | 1/1996 | Sato et al. | 257/666 |
| 5,530,281 | 6/1996 | Groover et al. | 257/666 |
| 5,614,760 | 3/1997 | Osono et al. | 257/668 |
| 5,654,585 | 8/1997 | Nishikawa | 257/666 |

FOREIGN PATENT DOCUMENTS 03-030362  2/1991  Japan ..................... 437/220

*Primary Examiner*—John Niebling
*Assistant Examiner*—Kevin F. Turner
*Attorney, Agent, or Firm*—Hickman Beyer & Weaver, LLP

[57] ABSTRACT

A variety of lead configurations for use in packaged semiconductors, the leads including integral finger locking mechanisms to prevent leads from pulling out of an encapsulated package, and their method of manufacture. Each finger is comprised of a bent portion of the lead and has a length of approximately two to four times the thickness of the lead body. A finger may be integrally located at the lead tip or, where the lead includes one or more tabs, a finger may extend from any number of the tab edges. Any number of leads within a semiconductor package may incorporate a finger, and each lead may incorporate a plurality of fingers. A method of manufacturing the finger locking mechanism of the current invention includes forming a lead frame in a conductive strip, wherein the lead tips are separated from the die attach pad, so as to retain a sufficient length of each lead in appropriate locations to accommodate the formation of fingers by bending. In the case of a finger extending from a tab, the tab is separated from the lead body by a length equal to the intended length of the finger to be formed. The process further includes the bending of the one or more fingers, the process further includes downsetting of the die attach pad. The step of bending the finger is accomplished during the step of forming the leads or, in the case where the lead frame includes a die attach pad that is to be downset, during downsetting. After the integrated circuit is assembled, it is encapsulated in plastic, whereby the finger locking mechanisms engage the encapsulating material to inhibit movement of the associated leads with respect to the plastic encapsulating material.

10 Claims, 5 Drawing Sheets

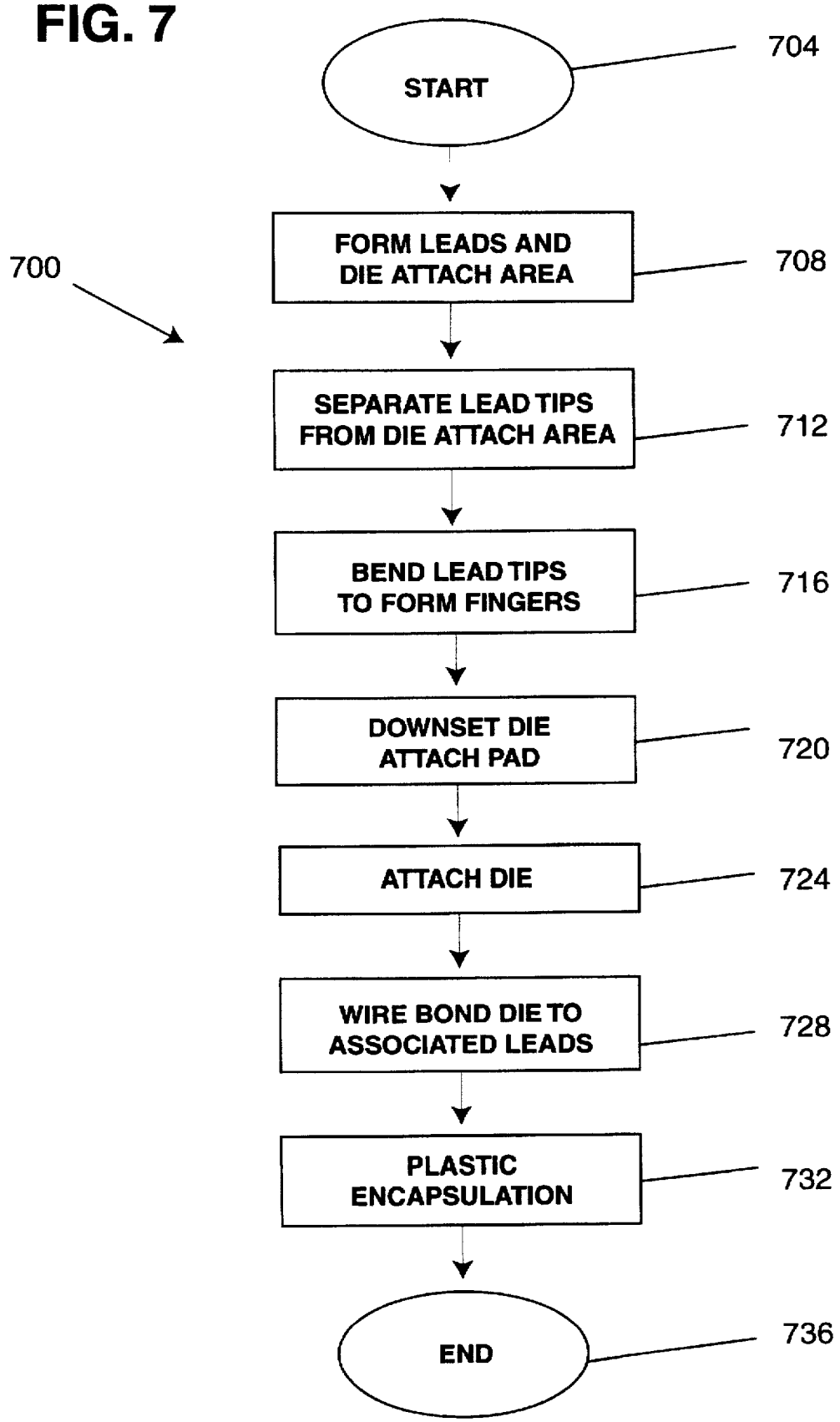

LEAD FRAME WITH LEAD FINGER LOCKING FEATURE AND METHOD FOR MAKING SAME

BACKGROUND OF THE INVENTION

The present invention relates generally to lead frames for use in integrated circuit packages. More specifically, a variety of lead frames including lead finger locking mechanisms, which prevent leads from pulling out of an encapsulated package, and their method of manufacture are disclosed.

In the field of integrated circuit packaging, the durability of the packaged semiconductors is of major concern. Any improvement that increases the durability of the package may provide a significant commercial advantage. By way of example, the leads of today's packages may potentially become disengaged from components within the package to which the leads are attached, likely rendering the circuit inoperable. This sometimes occurs when the lead slips out of an encapsulating packaging material along the longitudinal axis of the lead. Lead frame locking mechanisms may have been created to try to maintain the leads in their original position within the encapsulating material and relative to circuit components to which they are attached, but improvements are still needed.

Two current locking mechanisms used with leads formed from metallic strips are depicted in FIG. 1. The two are shown integral with a single lead, although each type is commonly used separately and individually in a single lead. FIG. 1 shows a plan view of a single lead of the several that would typically form a lead frame, the entire lead lying in substantially a single plane. One locking mechanism includes one or more holes 13a, 13b through the body of the lead 11. Encapsulating material may flow together from both sides of the lead through the holes. After hardening, the material within the holes forms a plastic pin which would have to be broken if the lead were to move longitudinally. One or more tabs 14a, 14b extending from either or both sides of the lead body 11 and lying in the same plane as the body 11, form a second type of locking mechanism. Such structures inhibit longitudinal movement within the lead plane by creating a surface, perpendicular to that plane, upon which the encapsulating material may exert a force in reaction to the force tending to move the lead, thereby restricting the lead movement. Given the longitudinal component of a potentially dislodging force acting upon a lead within an encapsulated package, that lead is maintained in its position by various mechanisms. These include the frictional force between the lead surface and the encapsulating material, as well as the longitudinal reactive force which the encapsulating material may impart on those portions of the lead that lie in a plane transverse to the lead longitudinal axis. For example in the case of the hole type of locking mechanism, the force which the encapsulating material may impart onto the lead is proportional in the thickness of the lead multiplied by the diameter of the hole. As another example, when a conventional tab locking mechanism is used, the reactive force which may be imparted to the lead is substantially proportional to the lead thickness multiplied by the length of the tab.

While these mechanisms provide some reduction in lead movement, there is a need and economic advantage to further inhibiting such lead slippage in integrated circuit packages, while maintaining cost effectiveness. This is especially true for packages that are to endure high longitudinal forces during manufacture.

SUMMARY OF THE INVENTION

To achieve the foregoing and other objects and in accordance with the purpose of the present invention, a variety of lead configurations which include an integral finger locking mechanism, and their method of manufacture are disclosed. The finger is comprised of a bent portion of the lead and has a length of approximately two to four times the thickness of the lead body. In one embodiment the lead has a finger transversely extending from a lead tip. In another embodiment, the lead includes a tab on either side of the lead body, and a finger transversely extending from an edge of each tab. In various embodiments, the angles which the associated fingers make with the lead body are in the range of approximately 45–90 degrees, and preferably are in the range of approximately 60–90 degrees. Other embodiments include various combinations of fingers extending from the lead tip or edges of the tabs.

The manufacture of the finger locking mechanism of the current invention is accomplished from a strip of conductive material. A strip is first exposed to a suitable method of forming a lead frame in the conductive strip, for example etching or stamping. In one embodiment the lead frame is formed such that a plurality of leads extend radially about an area suitable for placement of a die, such as a die attach pad. In the case of a die attach pad, the leads are then separated from the die attach pad, leaving a sufficient length of each lead in appropriate locations to accommodate the formation of fingers by bending. In the case of a finger extending from a tab, the tab is separated from the lead body by a length equal to the intended length of the finger to be formed. The process further includes the bending of the one or more fingers. In the case of a die attach pad that is to be downset, the process further includes downsetting of the die attach pad. The step of bending the finger may be accomplished during the step of forming the leads, or during downsetting. The process concludes with attaching a die which includes wire bond pads, connecting the wire bond pads to associated lead tips using bonding wires, and encapsulating the die attach pad, die, bonding wires, and at least a portion of the leads in plastic.

BRIEF DESCRIPTION OF THE DRAWINGS

The inventions, together with further objects and advantages thereof, may best be understood by reference to the following description taken in conjunction with the accompanying drawings in which:

FIG. 7 is a flowchart representing one preferred method of forming and packaging a lead frame in accordance with the present invention.

DETAILED DESCRIPTION OF THE INVENTION

Figure 2A:
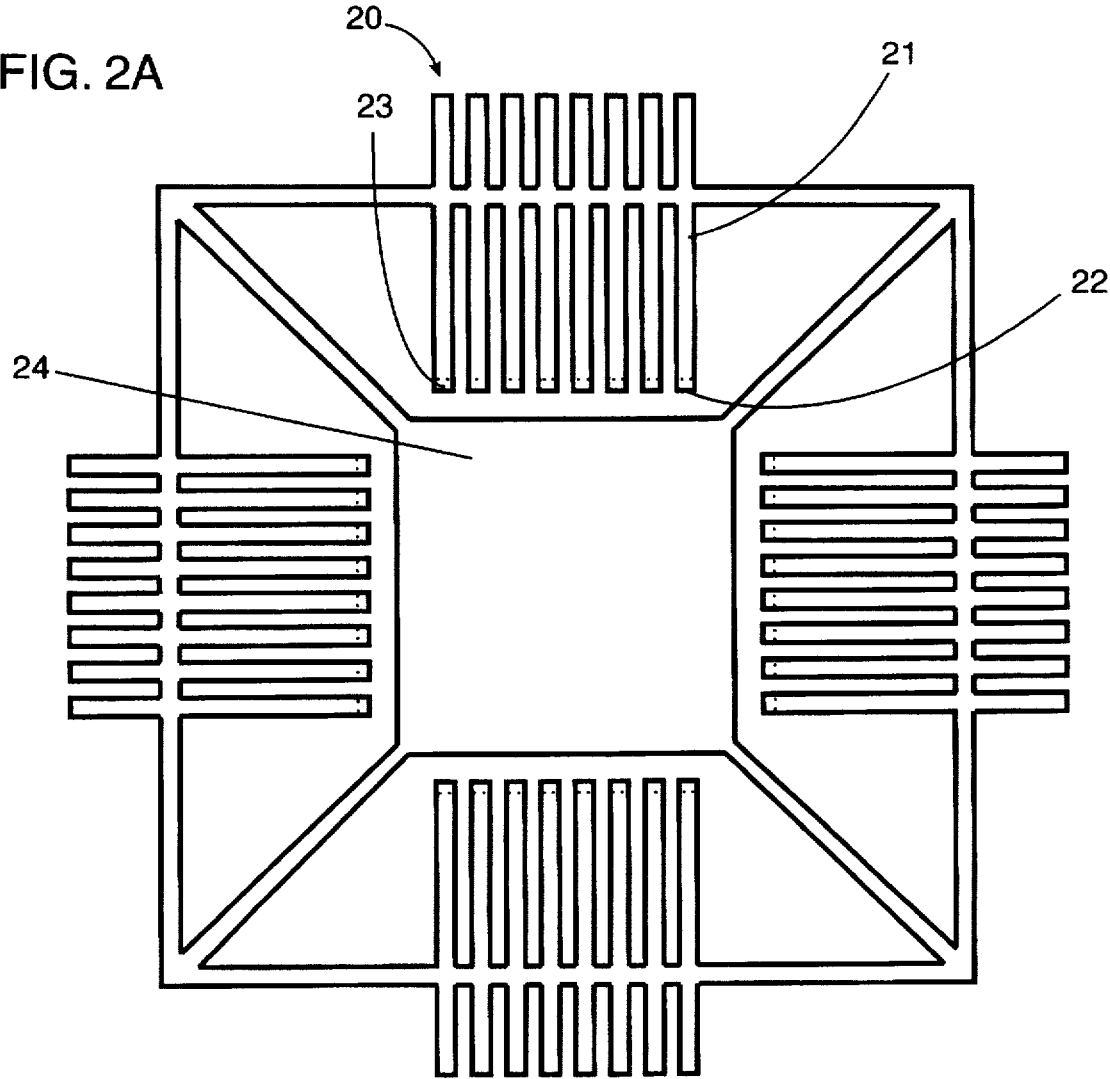
FIG. 2A is a diagrammatic plan view of one type of lead frame incorporating leads having a downturned finger extending from each lead tip as depicted in FIG. 2A.

In general, the present invention relates to a more effective mechanism for locking leads of an encapsulated integrated circuit (hereinafter "IC") in the encapsulating material. One example of such leads incorporated within a lead frame is depicted in FIG. 2A. Several leads 20 substantially form a plane and radially surround a die attach pad 24. As will be appreciated by those skilled in the art, any configuration that is suitable for receiving a die may be included either alternatively or in addition to a die attach pad. The leads 20 are oriented such that each lead body 21 extends from the periphery of the die attach pad 24, with a lead tip 22 of each lead 20 located adjacent to the die attach pad 24. The current invention may further be incorporated into an IC package, for example in a configuration such as that shown in FIG. 2B. In addition to a lead frame incorporating the finger locking mechanisms of the current invention, the IC package may also include other suitable IC components such as those shown in FIG. 2B, including a die 25 attached to a downset die attach pad 24, as well as wires 26 bonded to associated die wire bonding pads 27 at one end and to associated lead tips 22 at the other end to electrically couple the die 25 to the leads 20. Further, the assembled IC package is encapsulated in plastic 28 to protect the components and their interconnections.

Figure 2B:
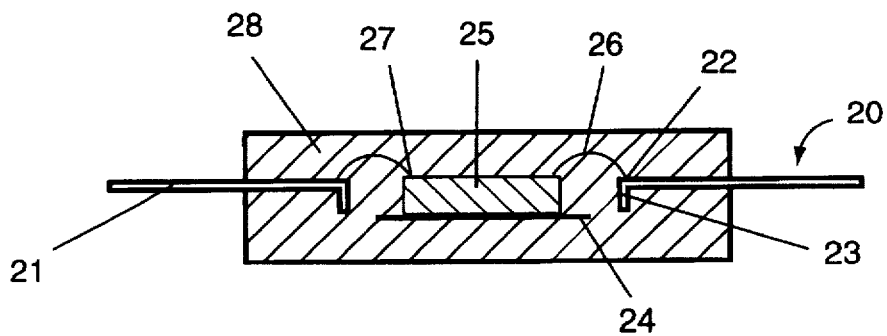
FIG. 2B diagrammatically depicts a cross sectional elevation view of an encapsulated package including a lead frame such as that shown in FIG. 2A.

The present invention more specifically relates to a finger 23 extending from each lead 20 for restraining the associated lead from moving along the lead longitudinal axis when surrounded by encapsulating material 28. For ease of explanation and depiction, the locking mechanisms associated with a single lead will be discussed, although any number of the leads included in an IC package may be configured with the same locking mechanisms of the present invention. In a preferred embodiment of the present invention, each lead includes at least one lead finger. The particular embodiments depicted in FIGS. 2A, 2B, 3 and 4 comprise a downturned finger 23, 33, 43 located at, and as an extension of, the lead tip 22. In the case, as depicted in FIGS. 2A and 2B, where a die attach pad 24 is included, the length of each finger 23 is less than the distance between the associated lead tip and the die attach pad. As shown in FIG. 2B, the finger locking mechanisms 23 act to anchor the associated leads 20 within the encapsulating plastic 28. Thus the fingers of the present invention fix the leads in the same location relative to the other IC components as they were when the package was first encapsulated, and do so much more effectively than current locking mechanisms.

Figure 1:
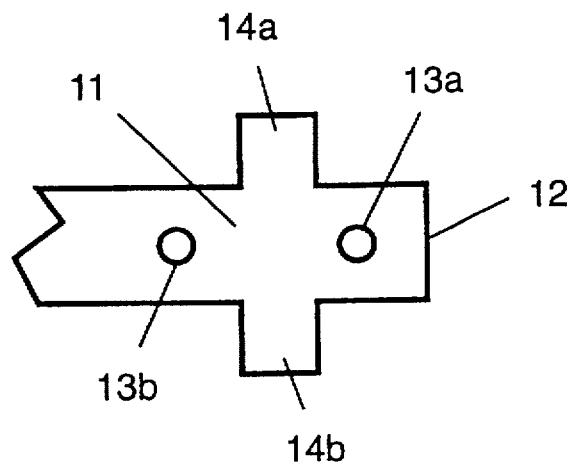
FIG. 1 is a diagrammatic plan view of a single lead of a lead frame with conventional locking mechanisms.
Figure 3:
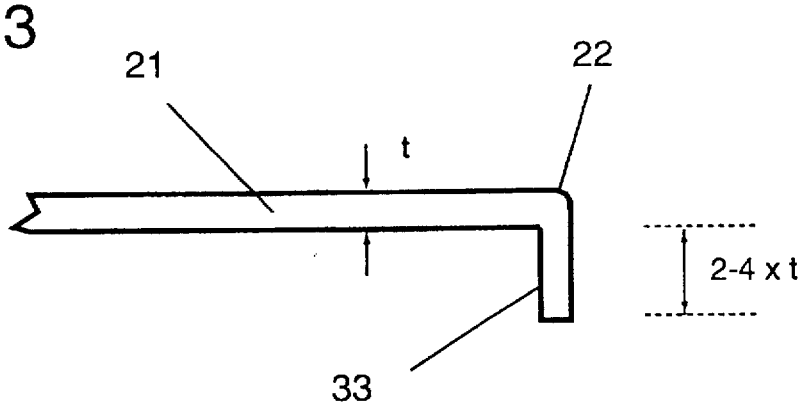
FIG. 3 is a diagrammatic elevation view of a lead in accordance with the embodiment of the present invention with a downturned finger extending from the lead tip at an angle of substantially 90 degrees from the lead plane.
Figure 4:
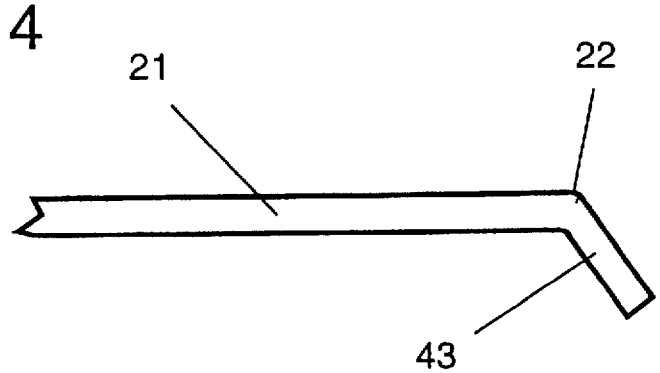
FIG. 4 is a diagrammatic elevation view of a lead with a downturned finger extending from the lead tip similarly to that depicted in FIG. 3, but at an angle less than 90 degrees from the lead plane.

One embodiment, shown in FIGS. 3 and 4, incorporates a finger at the lead tip. The finger 33, 43 is oriented at an angle from the lead plane. A wide variety of angles are suitable, and may be within a wide range of values which provide improved locking characteristics over conventional methods. However, it is preferred that the angle of the finger from the lead plane be within the range of approximately 45–90 degrees, and it is more preferred that it be in the range of approximately 60–90 degrees. Angles outside of these ranges are less advantageous for various reasons, including that they may be more difficult to process or may have less locking capability. Further, the finger 33, 43 is of a length suitable for engaging encapsulating plastic in the longitudinal direction to a greater degree than most conventional locking mechanisms. By way of example, finger lengths in the range of approximately two to four times the thickness of the lead will work well in most applications.

Figure 5A:
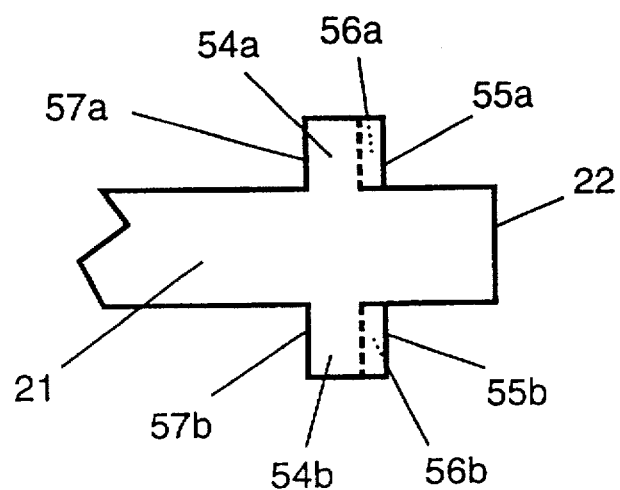
FIG. 5A is a diagrammatic plan view of a lead according to a second embodiment of the present invention with a tab on either side and a finger transversely extending from the distal edge of each tab.
Figure 5B:
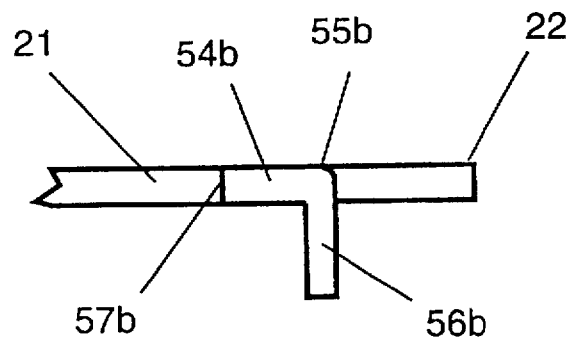
FIG. 5B diagrammatically depicts an elevation view of the lead depicted in FIG. 5A, with the fingers at an angle of substantially 90 degrees from the lead plane.

Another embodiment, as depicted in FIGS. 5A and 5B, includes an integrally formed tab 54a, 54b extending from either side of the lead body 21. Each tab has a proximate edge and a distal edge, substantially parallel to each other, with the distal edge located closer to the tip than the proximate edge. Further, fingers 56a, 56b, integrally formed with the tabs 54a, 54b, extend from the distal edge 55a, 55b of each tab 54a, 54b at an angle from the lead plane. Again, it is preferred that the angle be within the range of approximately 45–90 degrees, and it is more preferred that it be in the range of approximately 60–90 degrees. In a preferred embodiment of the present invention the lead includes at least one tab 54a, 54b and associated finger 56a, 56b on each side of the lead body 21. Although FIGS. 5A and 5B show the fingers 56a, 56b extending from the distal edges 55a, 55b of the tabs 54a, 54b, fingers may extend alternatively or additionally from the proximate edges 57a, 57b of the lead tabs 54a, 54b.

Figure 6A:
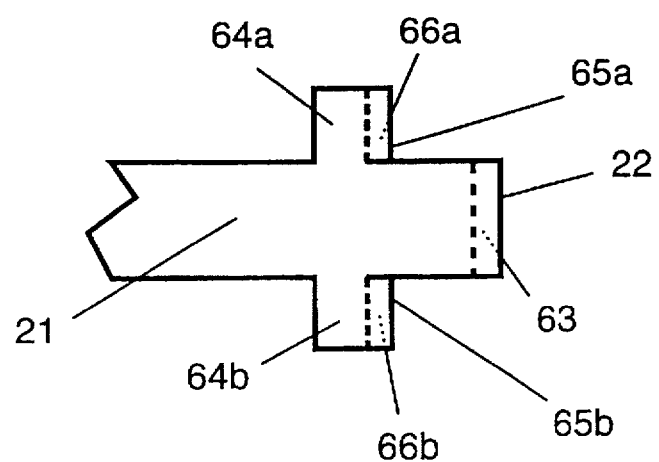
FIG. 6A is a diagrammatic plan view of a lead according to a third embodiment of the present invention with a downturned finger extending from the lead tip, a tab on either side, and a finger transversely extending from the distal edge of each tab.
Figure 6B:
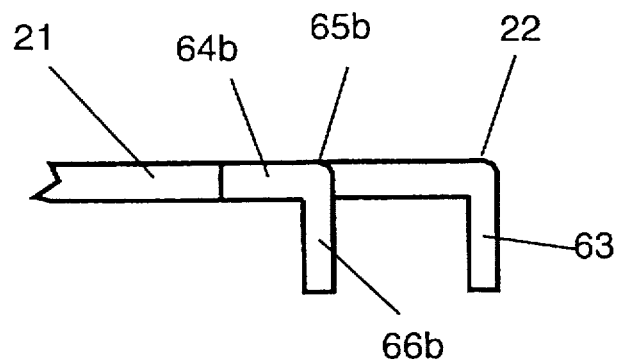
FIG. 6B is a diagrammatic elevation view of the lead depicted in FIG. 6A, with the fingers at an angle of substantially 90 degrees from the lead plane.

The present invention includes the above described configurations of finger locking mechanisms alone or in any suitable combination of location, number or orientation with respect to the lead plane. For example, FIGS. 6A and 6B show an embodiment according to the present invention including a finger 63 located at the lead tip 22 and a finger 66a, 66b located at the distal edge 65a, 65b of each of two tabs 64a, 64b.

The area upon which the encapsulating material reactive force will act in response to a potentially dislodging longitudinal force upon the lead, is the area of the finger as projected in the plane perpendicular to the lead longitudinal axis. As described above, the conventional locking mechanisms provide an area approximately equal to the sum of the products of lead thickness and tab lengths or hole diameters. Because the finger length may be much larger than the thickness of the lead, and the finger width may easily be the same as the width of the lead, the present invention provides more area than that provided by current conventional locking mechanisms, and thus provides more restraint to longitudinal movement.

The method of the current invention may be better understood with reference to the flow chart of FIG. 7 depicting one method 700 of manufacturing an IC package which contains one embodiment of the lead finger locking mechanisms. The process 700 begins with a start point 704 where a strip of conductive material from which a lead frame is intended to be formed is introduced into a manufacturing device. The ship may be composed of any suitable conductive material which is well known to those skilled in the art, as for example cooper. In a formation step 708, a plurality of leads and one or more die attach areas are substantially formed from the metal strip. The die attach area may include any conventional configuration suitable for receiving a die, for example a die attach pad or void area. To facilitate description of the process, the following description refers to an embodiment including a single die attach pad, although other embodiments may include additional die attach areas. The formation of the leads and die attach pad include any suitable conventional tooling methods well known to those skilled in the art. By way of example, the frame pattern may be stamped or etched. The tips of the leads are formed in close proximity to the die attach pad, and in one embodiment the plurality of leads are arranged radially around the die attach pad. At this point in the process 700, the lead tips may be connected to the die attach area by remaining portions of the metal strip.

The process 700 further includes a step 712 where the lead tips are separated from the die attach area, using any suitable method well known to those skilled in the art, such as stamping or etching. In one embodiment of the present invention the separation method is the same as the lead formation method, and a lead frame such as that shown in FIG. 2 results. The process continues with a step 716 where the lead tips are bent to form finger locking mechanisms. Any suitable means is used to change the angle of the lead tip portion, relative to the lead frame plane, to the angle desired for the lead finger, as for example by stamping means. In one embodiment, the bending is performed during the step 712 of separating the lead tips from the die attach area.

In another step 720, the die attach pad is down set such that the die attach pad then lies in a plane parallel to and offset from the plane formed by the remainder of the lead frame. In one embodiment, the relative configuration of the leads and die attach pad as shown in FIG. 2B results. In an alternative embodiment of the present invention, the bending of the lead tips 716 is accomplished simultaneously with the downsetting step 720. By bending the lead tips during a manufacturing step which already exists, for example during stamping or downsetting, there is little to no increase in time or associated cost for manufacture which includes the improved locking mechanism of the current invention.

In a further step 724, a die having a plurality of bond pads is positioned on and attached to the die attach pad in any conventional manner. Additionally, a step 728 is performed where a set of bonding wires are connected on one end to associated bonding pads, and to associated lead tips on the other end. The actual connection of bonding wires is accomplished by any method known to those of skill in the art, however changes in machinery may be necessary to accommodate the fingers of the current invention, as for example a chuck used to hold the partial IC package from below may need to be modified to accommodate a finger that extends downward from the lead.

In an encapsulating step 732, a substantial amount of the packaging, e.g. the die attach pad, the die, the bonding wires, and a portion of the leads are encapsulated with plastic to provide a protective package, leaving exposed a portion of the lead frame to facilitate electrical connection of the IC package to external circuitry. The wire bonding step 728 and encapsulating step 732 may be performed according to conventional steps well known to those skilled in the art.

Process 700 comes to an end in a step 736 which typically includes post assembly steps which are well known to those skilled in the art. Such steps may include disconnecting the outer portion of the lead frame from the plurality of leads, such that the leads are no longer interconnected, and bending down the portion of the leads which are not encapsulated.

The present invention provides substantial improvements over leads using either no locking mechanisms, or conventional locking mechanisms. Because the fingers of the present invention may engage the encapsulating material to a greater degree, the present invention increases the locking capacity and thus decreases the likelihood of an associated lead being pulled from the encapsulated package. Further, an additional substantial advantage of the present invention is that the fabrication of leads with such locking mechanisms may be accomplished with little change to existing equipment, at insignificant in manufacturing cost or time.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

What is claimed is:

1. A method of forming a lead frame for use in a packaged semiconductor device, the method including the steps of:
   forming a plurality of leads from a conductive strip, each lead including a lead tip portion and a body portion, the plurality of leads being oriented in a substantially planar manner to define a lead frame plane, wherein a selected one of the leads includes an integral tab extending from a side of the lead body portion substantially within the lead frame plane; and
   bending a portion of the integral tab on the selected lead to form a finger integrally extending transversely relative to the lead frame plane to create an integral locking mechanism.

2. The method of making a lead frame for a packaged semiconductor device as recited in claim 1, wherein:
   the step of forming a plurality of conductive leads includes the substeps of:
      removing portions of the conductive strip such that a die attach pad is formed with the leads radially surrounding the die attach pad, and
      separating tip portions of the leads from the die attach pad; and
   wherein the tip portion of the selected lead is bent to form a second finger extending transversely relative to the lead frame plane.

3. The method of making a lead frame for a packaged semiconductor device as recited in claim 1, wherein the length of the bent portion of the selected lead is in the range of approximately 2 to 4 times the lead thickness.

4. The method of making a lead frame for a packaged semiconductor device as recited in claim 1, wherein:
   the tab includes an edge adjacent to the lead body portion; and
   the step of forming the leads further includes separating the tab at the intersection of the tab and body, for a distance extending from the edge to define a finger length of the formed finger.

5. The method of making a lead frame for a packaged semiconductor device as recited in claim 2, wherein the step of bending the tab and tip portions of a selected lead to form fingers is performed during the step of separating the tip portions of the leads from the die attach pad.

6. The method of making a lead frame for a packaged semiconductor device as recited in claim 1, further comprising the step of downsetting the die attach pad, wherein the step of bending a portion of the integral tab on a selected lead to form a finger is performed simultaneously with the step of downsetting the die attach pad.

7. A method of packaging an integrated circuit, comprising the steps of:

forming a plurality of leads from a conductive strip, each lead including a tip edge, a tip portion, a body portion, and a pin portion, the plurality of leads being oriented in a substantially planar manner to define a lead frame plane, including the substeps of:

removing portions of the conductive strip such that a die attach pad is formed with the leads radially surrounding the die attach pad, and separating tip portions of the leads from the die attach pad;

bending the tip portion of a selected lead to form a finger extending transversely relative to the lead frame plane to create an integral locking mechanism;

attaching a die to the die attach pad, the die having a plurality of bond pads;

electrically interconnecting the bond pads to associated leads; and encapsulating the die, die attach pad, electrical interconnecting means, and a portion of the lead frame with a plastic encapsulating material such that the encapsulating material completely surrounds and electrically isolates the lead tip edge, and lead tip portion of the finger but does not encapsulate the lead pin portion thereby forming pins extending from a package formed by the encapsulating material, wherein the finger forms a lock which engages the plastic encapsulating material and impedes movement of the selected lead relative to the encapsulating material.

8. The method of packaging an integrated circuit as recited in claim 7, wherein:

the step of forming the plurality of conductive leads is performed such that the selected lead further includes an integral tab extending from a side of the lead body portion substantially within the lead frame plane; and the finger is formed on the selected lead by bending a portion of the tab such that the finger integrally extends transversely from the tab.

9. The method of packaging an integrated circuit as recited in claim 7, wherein the step of bending a portion of the selected lead to form a finger is performed during the step of separating the tip portions of the leads from the die attach pad.

10. The method of packaging an integrated circuit as recited in claim 7, further comprising the step of downsetting the die attach pad, wherein the step of bending a portion of the selected lead to form the finger is performed simultaneously with the step of downsetting the die attach pad.

* * * * *